United States Patent

Marlow et al.

[11] Patent Number: 5,804,994
[45] Date of Patent: *Sep. 8, 1998

[54] COMPARATOR CIRCUIT WITH HYSTERESIS

[75] Inventors: C. Allen Marlow, Ann Arbor; Eric J. Danstrom, Farmington Hills, both of Mich.

[73] Assignee: SGS-Thomson Microelectronics, Inc., Carrollton, Tex.

[*] Notice: The term of this patent shall not extend beyond the expiration date of Pat. No. 5,656,957.

[21] Appl. No.: 856,219

[22] Filed: May 14, 1997

Related U.S. Application Data

[63] Continuation of Ser. No. 545,037, Oct. 19, 1995, Pat. No. 5,656,957.

[51] Int. Cl.$^6$ .............................. H03K 5/22; H03K 3/037
[52] U.S. Cl. ........................ 327/67; 327/74; 327/205
[58] Field of Search ................................. 327/65–68, 73, 327/74, 77–81, 87, 89, 142, 205, 206

[56] References Cited

U.S. PATENT DOCUMENTS

| | | | |
|---|---|---|---|
| 4,553,045 | 11/1985 | Murotani | 327/206 |
| 5,162,671 | 11/1992 | Ishihara | 327/74 |
| 5,177,376 | 1/1993 | Wellnitz et al. | 327/73 |
| 5,334,883 | 8/1994 | Rosenthal | 327/206 |

*Primary Examiner*—Toan Tran
*Attorney, Agent, or Firm*—Theodore E. Galanthay; Lisa K. Jorgenson; Renee M. Larson

[57] ABSTRACT

A comparator with hysteresis which has a bias current circuit, a differential input stage, and an output stage is disclosed. The differential input stage uses a parallel transistor and an enabling transistor connected in parallel to one of the differential pair transistors to create hysteresis. The parallel transistor and enabling transistor are used to generated an effective offset voltage which must be overcome for the comparator to switch states.

5 Claims, 3 Drawing Sheets

COMPARATOR CIRCUIT WITH HYSTERESIS

This is a Continuation, of application Ser. No. 08/545,037, filed Oct. 19, 1995, now U.S. Pat. No. 5,656,957.

BACKGROUND OF THE INVENTION

1. Field of the Invention

This invention relates to electronic circuits used as comparators, and more specifically to electronic circuits used as comparators with built-in hysteresis.

2. Description of the Relevant Art

The problem addressed by this invention is encountered in electronic circuits used to compare a first voltage to a second voltage. Commercially available comparators, such as an LM2904 are readily available and are often used to compare voltages. The LM2904 is designed for low hysteresis and low offset. However, it may be desirable in some applications to have hysteresis, such as in a reset circuit. FIG. 1 shows a prior art comparator, such as the LM2904, configured to have hysteresis as is known in the prior art. More specifically, FIG. 1 shows comparator 10 having a non-inverting input 4, an inverting input 12, and an output 8. Resistor 6 and resistor 3 add hysteresis to circuit, as is known in the art. Typical resistor values for this configuration are 10 kilo-ohm for resistor 3 and 1 mega-ohm for resistor 6. In fact, a problem with this circuit is that large resistor values are required and/or the circuit has an undesirable low gain.

FIG. 2 shows a prior art comparator circuit 16. This circuit includes a bias circuit 18, a differential input stage 20, and a hysteresis circuit 22. The bias circuit includes current source 24 connected in series with NPN bipolar transistor 26 and resistor 28. In operation, current is generated by current source 24 to forward bias transistor 26. This creates a bias voltage which is used by the transistors in the differential input stage 20 and by transistor 48 of the comparator 16.

The differential stage includes PNP transistors 30, 36, 40 and 44, NPN transistors 32 and 46, resistors 38 and 42, and current source 34. In operation, the base of transistor 36 is the non-inverting input of comparator 16 and the base of transistor 40 is the inverting input. When the base of transistor 36 is at a higher voltage than the base of transistor 40, transistor 40 turns on and conducts the current supplied by current source 34 while transistor 36 is off. Consequently, the transistor 46 is turned off which allows transistor 44 to drive the voltage on $V_{out}$ high. Conversely, if the base of transistor 36 is lower than the base of transistor 40, then transistor 36 is on and transistor 40 is off. This condition drives the emitter of transistor 46 low which turns transistor 46 on. Since transistor 46 is on, $V_{out}$ is driven to a low voltage.

The hysteresis circuit 22 includes PNP transistor 48 and resistor 50. In operation, transistor 48 turns on when the V⁻ input of the comparator is at a sufficiently low value to turn on transistors 40 and 48. With transistor 48 on, a voltage drop is developed across resistor 50. Therefore, the additional voltage drop is the hysteresis which must be overcome to switch the comparator when the voltage on the V⁻ input rises.

The problem with the prior art circuit in FIG. 2 is that the circuit requires resistors 38 and 42 to be relatively low resistance so that the circuit can have sufficient dynamic range without the transistors in the differential stage operating in saturation. Consequently, the circuit in FIG. 2 suffers from low gain.

FIG. 3 shows a circuit which is very similar to FIG. 2 and differs only in how the hysteresis in the circuit is achieved. FIG. 2A shows a bias current circuit comprising transistor M18, Q29, and resistor R40. The differential input stage comprises transistors Q0, Q1, Q2, Q3, Q4, and Q5. The output stage comprises M15 and M19. M13, M14, M15, M16, and M51 are current sources for the circuit. The base of Q3 is the inverting input and the base of Q0 is the non-inverting input of the differential stage. Resistors R26, R29, and R36 form a voltage divider to set up the voltage reference for the inverting input and to form the hysteresis circuit.

In operation, the output of the circuit, opoff, switches when the input, drain, rises to the threshold voltage of the circuit. At that point, Q0 and Q1 turn off while transistors Q3 and Q2 turn on. With Q3 on, M36 and M19 are turned on thereby activating the hysteresis circuit and pulling the output to a low voltage, respectively. The hysteresis circuit is activated by transistor M36 effectively shorting resistor R30 which effectively changes the voltage reference on the inverting input. The problem with this circuit is that current is always flowing in through the voltage divider network. Additionally the resistor R36 reference voltage tends to vary.

FIG. 4 shows another prior art circuit for generating hysteresis in a comparator. In this example, resistor 50 and bipolar transistor 52 set up a bias voltage which is used by transistors 54 and 56 to generate bias currents for the differential pair. Transistors 64 and 70 form the differential pair of this comparator. The hysteresis for this circuit is generated by turning on or off transistor 56 with transistor 72 and by running the emitter current of transistor 70 through resistor 68. When the voltage at the base of transistor 64 is sufficiently higher than the voltage on the base of transistor 70, transistor 62, transistor 64 and transistor 66 are turned on and transistor 70 is turned off. Since transistor 70 is off and transistor 66 is on, the output voltage is high and transistor 72 is turned off. Therefore, transistor 56 is turned on and the current through the collector of transistor 64 is equal to the current flowing through transistors 54 and 56.

The comparator will switch states when the base voltage of transistor 70 is large enough to induce a current through transistor 70 which is equal to the current through transistor 64. Since the current requirement for the transition has now increased because transistor 56 is now on, whereas before it was turned off, the hysteresis is generated by the extra current through transistor 56 and the voltage drop across resistor 68. In other words, the hysteresis is generated by the tail currents of transistor 70.

SUMMARY OF THE INVENTION

Therefore, it is an object of the invention to provide a comparator which has high gain and easily designed hysteresis.

These and other objects, advantages, and features will be apparent to those skilled in the art from the following detailed description of the invention, when read in conjunction with the accompanying drawings and appended claims.

The invention can be summarized as a comparator with hysteresis which has a bias current circuit, a differential input stage, and an output stage. The differential input stage uses a parallel transistor and an enabling transistor connected in parallel to one of the differential pair transistors to create hysteresis. The parallel transistor and enabling transistor are used to generated a effective offset voltage which must be overcome for the comparator to switch states.

DETAILED DESCRIPTION OF AN EMBODIMENT OF THE INVENTION

Figure 1:
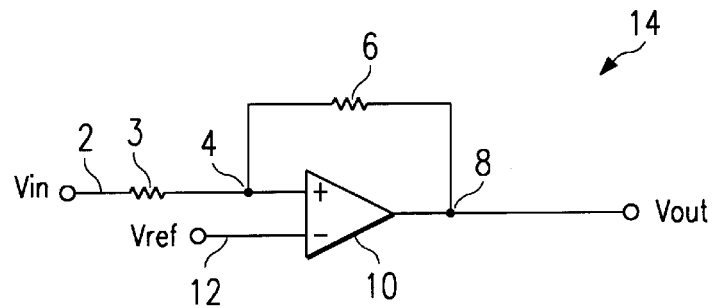
FIG. 1 is a block diagram of a comparator with hysteresis as known in the prior art.
Figure 2:
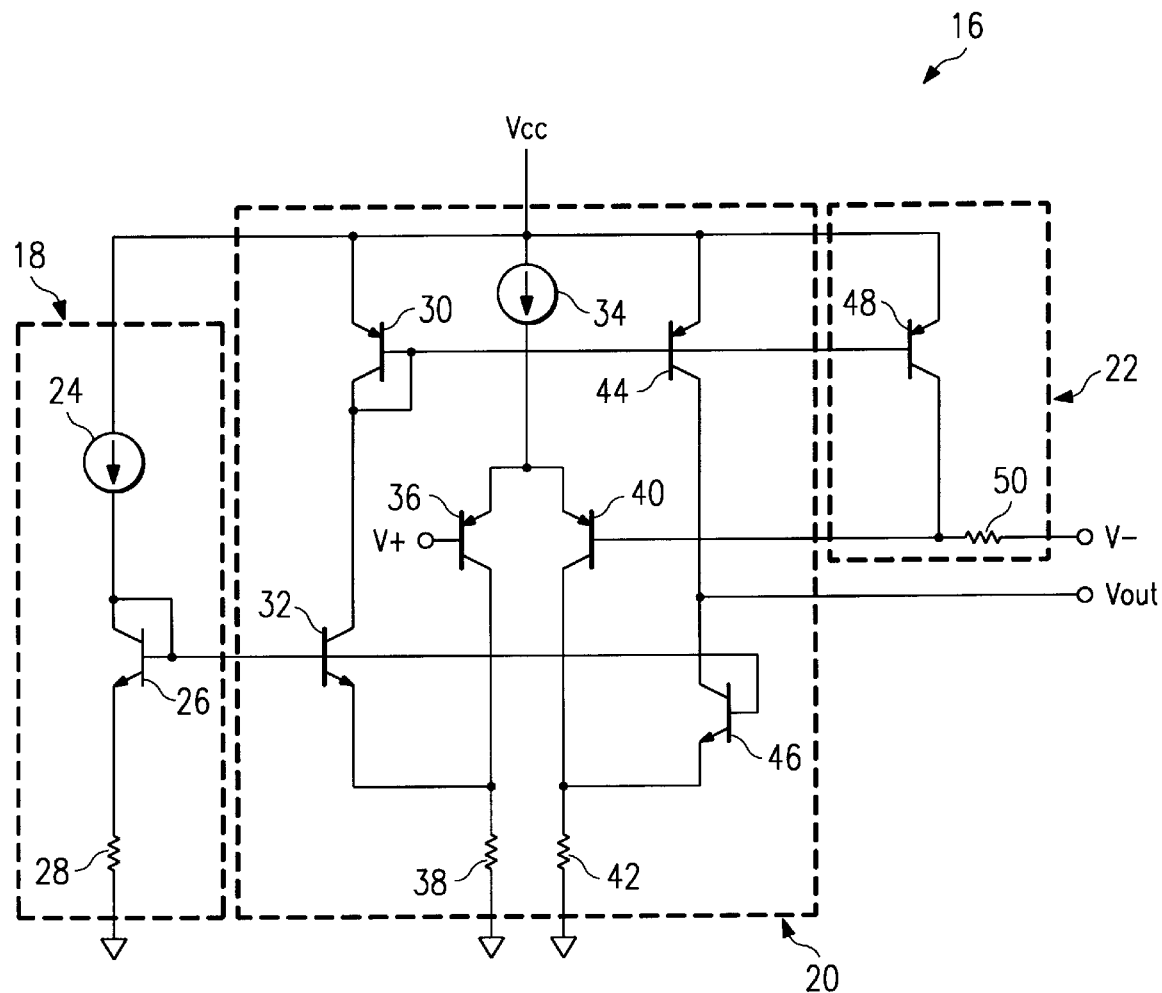
FIG. 2 is a schematic drawing of a comparator with internal hysteresis as known in the prior art.
Figure 3:
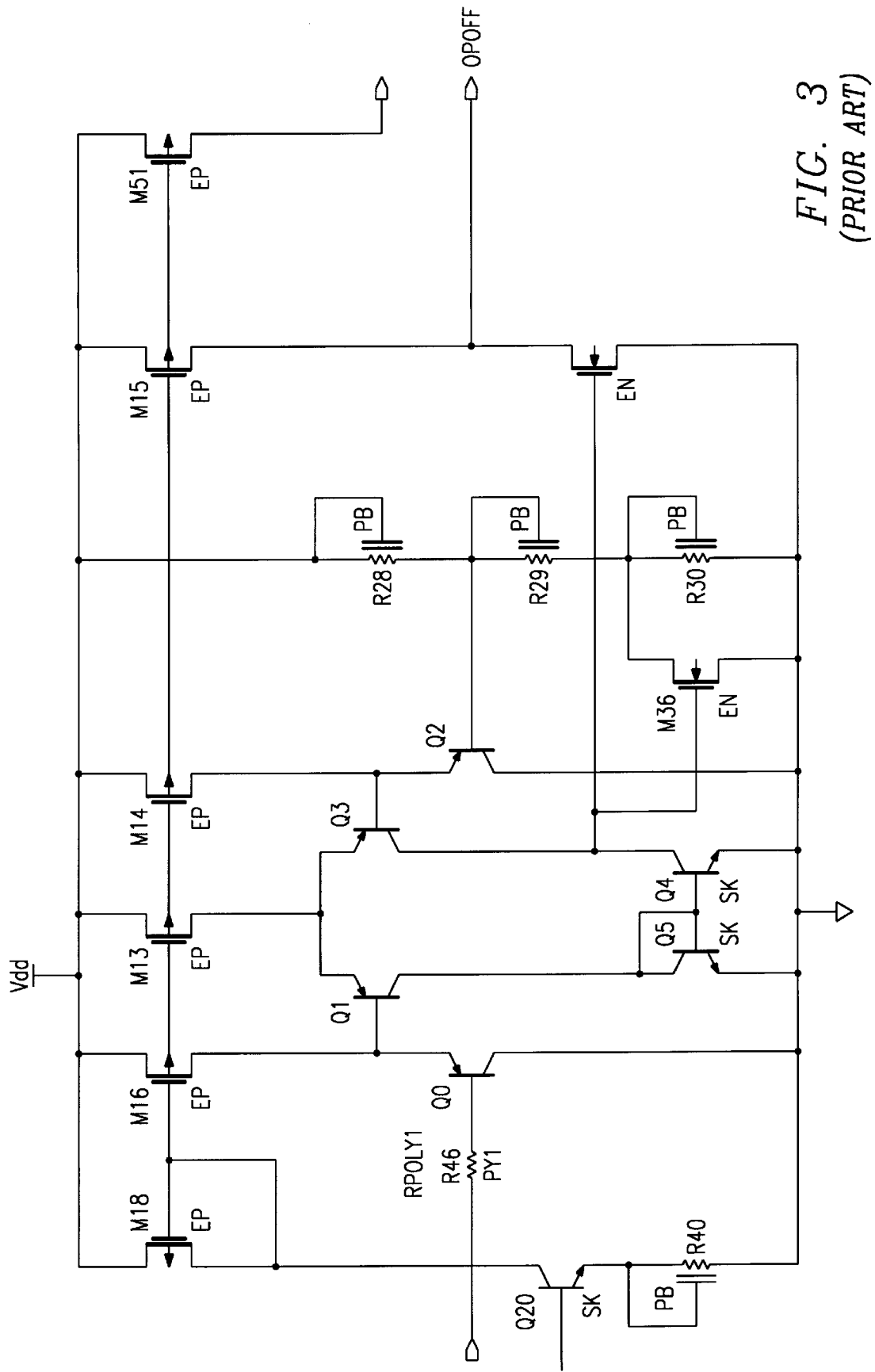
FIG. 3 is a schematic drawing of a second comparator with internal hysteresis as known in the prior art.
Figure 4:
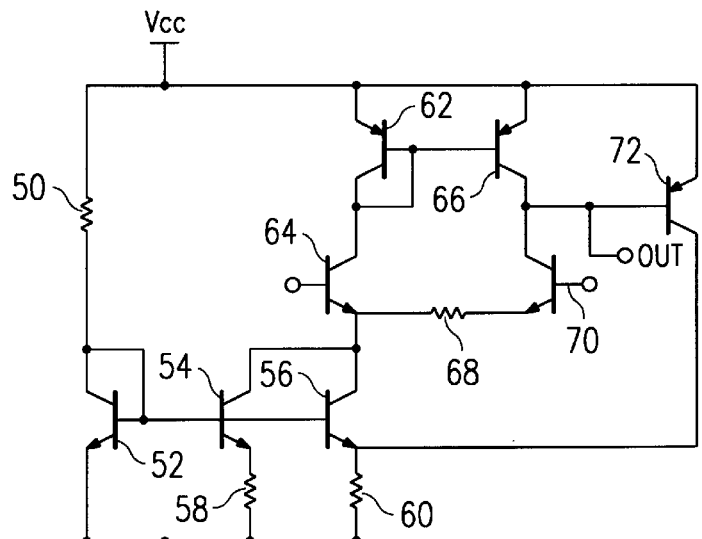
FIG. 4 is schematic drawing of a third comparator with internal hysteresis as known in the prior art.
Figure 5:
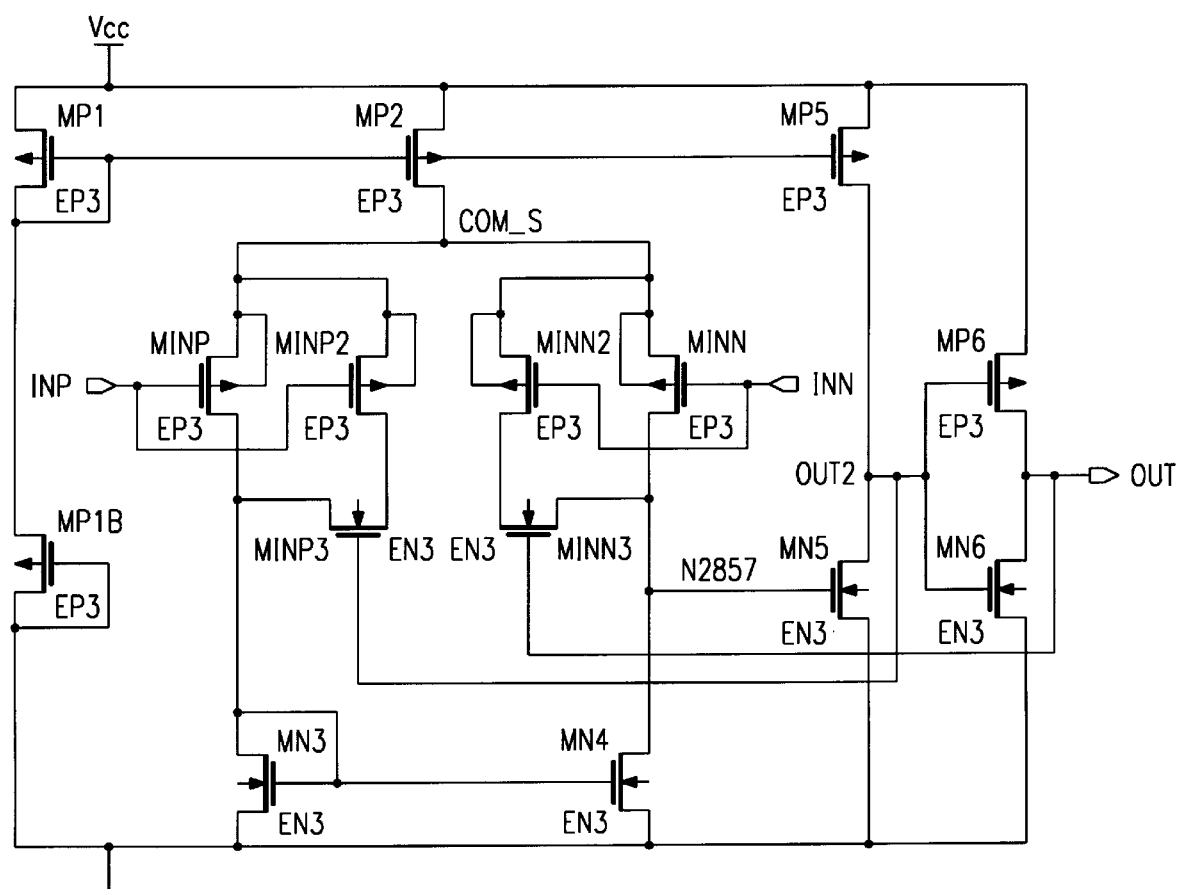
FIG. 5 is a schematic drawing of comparator with hysteresis as disclosed in an embodiment of the invention.

A comparator with hysteresis according to the embodiment in FIG. 5 will now be described. The comparator circuit is constructed from essentially three functional blocks: a bias current circuit, a differential input stage, and an output stage.

The bias current circuit is constructed by connecting the source of P-channel MOSFET transistor MP1 to a voltage source, Vcc. The gate and drain of transistor MP1 are connected to the source of P-channel MOSFET transistor MP1B and to the gates of P-channel MOSFET transistors MP2 and MP5. The gate and drain of transistor MP1B are connected to ground. The sources of transistors MP2 and MP5 are connected to Vcc. Therefore, bias currents are generated at the drains of transistors MP2 and MP5 for the use of the differential input stage and the output stage, respectively.

The differential input stage is constructed by connecting the sources of P-channel MOSFET transistors MINP, MINP2, MINN, and MINN2 to the drain of transistor MP2. The gate of transistor MINP is the noninverting input (INP) of the comparator and the gate of transistor MINN is the inverting input (INN) of the comparator. Transistors MINP and MINN form the differential pair of the comparator. The drain of transistor MINP2 is connected to the drain of N-channel transistor MINP3. The source of MINP3 is connected to the drains of transistors MINP and MN3. The gate of transistor MINP3 is connected to the drain of N-channel transistor MN5. The drain of N-channel transistor MINN3 is connected to the drain of transistor MINN2. The source of transistor MINN3 is connected to the drains of transistors MINN and MN4 and to the gate of MN5 and forms the output of the differential stage. The drain and gate of transistor MN3 are connected to the gate of transistor MN4. The sources of transistors MN3 and MN4 are connected to ground.

The output stage is constructed by connecting the gate of transistor MN5 to the output of the differential stage. The drain of transistor MN5 is connected to the drain of transistor MP5, to the gate of transistor EN3, and to the gates of transistors MP6 and MN6. Transistors MP6 and MN6 are connected to form an inverter, the output of which is the output of the output stage and, thus, the output of the comparator. The source of P-channel transistor MP6 is connected to Vcc. The source of N-channel transistor MN6 is connected to ground. The output of the inverter is connected to the gate of MINN3.

In operation, transistor MP2 supplies a bias current to the differential pair, which is shown as transistor MINP and transistor MINN. Although this differential pair is shown as just two P-channel transistors, it is well known in the art that differential pairs can be constructed with bipolar transistors as well as N-channel MOSFETs without departing from the spirit of the invention. When the input voltage INP on the gates of transistor MINP and MINP2 is much smaller than the input voltage INN, the bias current flows through transistor MINP which turns on transistor MN3 and MN4, which turns off transistor MN5. Thus, the input to the inverter formed by transistors MP6 and MN6 are driven high by the bias current generated by transistor MP5. Thus, the output of the comparator is at a low voltage state. Additionally, transistor MINN3 is off and MINP3 is on.

The comparator switches states when the INN voltage is sufficiently low relative to the INP voltage. This occurs qualitatively when the current flowing through MINN exceeds the current through MINP+MINP3. At that point, transistor MINN turns on while transistors MINP+MINP2 turn off, which turns transistors MN3 and MN4 off and MN5 on. Transistor MN5 then discharges the gates of transistors MP6 and MN6 which drives the output of the comparator high.

Since the gate of transistor MINP3 is connected to the input of the inverter and the gate of transistor MINN3 is connected to the output of the inverter, transistor MINN3 starts conducting while transistor MINP3 stops conducting. Qualitatively, the hysteresis is caused by the effective change in input offset voltage caused by adding another device in parallel in the inverting half of the differential pair after the comparator has switched states, MINN2 in this case.

Conversely, the comparator will switch states back when the voltage INN is sufficiently high enough, relative to the voltage INP so that the current flowing through transistor MINP exceeds the current of MINN+MINN2. At that point, transistors MINN and MINN2 stop conducting and transistor MINP turns on transistors MN3 and MN4 which turns off transistor MN5. Thus, the input to the inverter is driven high and the output is driven low. Then, the hysteresis is changed since MINN3 is turned off and MINP3 is turned on.

The hysteresis is controlled by controlling the mismatch in area in the differential pair which is controlled by either transistor MINP3 or transistor MINN3. Thus, this circuit provides the advantages of having a high gain and an easily designed hysteresis.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A method for generating hysteresis in a comparator comprising the steps of:

enabling a current path which is in parallel to a transistor of a differential pair when an output of the comparator is at a high voltage, wherein the transistor receives a differential input signal; and not enabling the current path when the output of the comparator is at a low voltage.

2. The method of claim 1 wherein the step of enabling the current path is performed using a MOSFET transistor.

3. The method of claim 2 wherein the MOSFET transistor is a N-channel transistor.

4. A method for generating hysteresis in a comparator comprising the steps of:

enabling a current path which is in parallel to a transistor of a differential pair when an output of the comparator is at a high voltage, wherein the transistor receives a differential input signal.

5. The method of claim 4, comprising the further step of:

not enabling the current path when the output of the comparator is at a low voltage.

* * * * *